(12) United States Patent
Galera et al.

(10) Patent No.: US 7,846,773 B2
(45) Date of Patent: Dec. 7, 2010

(54) MULTI-CHIP SEMICONDUCTOR PACKAGE

(75) Inventors: Manolito Galera, Singapore (SG);
Leocadio Morona Alabin, Singapore (SG)

(73) Assignee: Fairchild Semiconductor Corporation DE (US)

( * ) Notice: Subject to any disclaimer, the term of this patent is extended or adjusted under 35 U.S.C. 154(b) by 96 days.

(21) Appl. No.: 12/356,354

(22) Filed: Jan. 20, 2009

(65) Prior Publication Data
US 2010/0181660 A1    Jul. 22, 2010

(51) Int. Cl.
*H01L 21/00* (2006.01)

(52) U.S. Cl. .................................. 438/109; 438/107
(58) Field of Classification Search ................ 257/686, 257/777, 723, 724, 778; 438/108, 110, 107, 438/109
See application file for complete search history.

(56) References Cited

U.S. PATENT DOCUMENTS

| 6,258,626 | B1  |        | 7/2001 | Wang et al. |
|-----------|-----|--------|--------|-------------|
| 7,550,680 | B2  | *      | 6/2009 | Pendse ......................... 174/520 |
| 7,675,153 | B2  | *      | 3/2010 | Kurosawa et al. ........... 257/686 |
| 7,709,944 | B2  | *      | 5/2010 | Kuan et al. .................. 257/686 |
| 7,723,839 | B2  | *      | 5/2010 | Yano et al. .................. 257/700 |

* cited by examiner

*Primary Examiner*—S. V Clark
(74) *Attorney, Agent, or Firm*—Kirton & McConkie; Kenneth E. Horton

(57) ABSTRACT

Semiconductor packages that contain multiple stacked chips and methods for making such semiconductor packages are described. The semiconductor packages contain a full land pad array and multiple chips that are stacked vertically. Some of the chips are separated by routing leads which are connected to the land pad array. The chips can be directly connected to an inner part of the land pad array and a second and third chip are respectively connected to the middle and outer part of the land pad array through the routing leads that are connected to solder balls. The semiconductor packages therefore have a high input/output capability with a small package footprint, and a flexible routing capability. Other embodiments are also described.

16 Claims, 8 Drawing Sheets

MULTI-CHIP SEMICONDUCTOR PACKAGE

FIELD

This application relates generally to semiconductor devices and methods for making such devices. More specifically, this application describes semiconductor packages that contain multiple, stacked chips and methods for making such semiconductor packages.

BACKGROUND

Semiconductor packages are well known in the art. Often, these packages may include one or more semiconductor devices, such as an integrated circuit ("IC") die or chip, which may be connected to a die pad that is centrally formed in a lead frame which contain a series of leads. In some cases, bond wires electrically connect the IC die to a series of terminals that serve as an electrical connection to an external device, such as a printed circuit board ("PCB"). An encapsulating material can be used to cover the bond wires, the IC die, the terminals, and/or other components of the semiconductor device to form the exterior of the semiconductor package. A portion of the terminals and possibly a portion of the die pad may be externally exposed from the encapsulating material. In this manner, the die may be protected from environmental hazards—such as moisture, contaminants, corrosion, and mechanical shock—while being electrically and mechanically connected to an intended device that is external to the semiconductor package.

After it has been formed, the semiconductor package is often used in an ever growing variety of electronic applications, such as disk drives, USB controllers, portable computer devices, cellular phones, and so forth. Depending on the die and the electronic application, the semiconductor package may be highly miniaturized and may need to be as small as possible.

SUMMARY

This application relates to semiconductor packages that contain multiple stacked chips and methods for making such semiconductor packages. The semiconductor packages contain a full land pad array and multiple chips that are stacked vertically. Some of the chips are separated by routing leads which are connected to the land pad array. The chips can be directly connected to an inner part of the land pad array and a second and third chip are respectively connected to the middle and outer part of the land pad array through the routing leads that are connected to solder balls. The semiconductor packages therefore have a high input/output capability with a small package footprint, and a flexible routing capability.

BRIEF DESCRIPTION OF THE DRAWINGS

The following description can be better understood in light of the Figures, in which.

Figure 1:
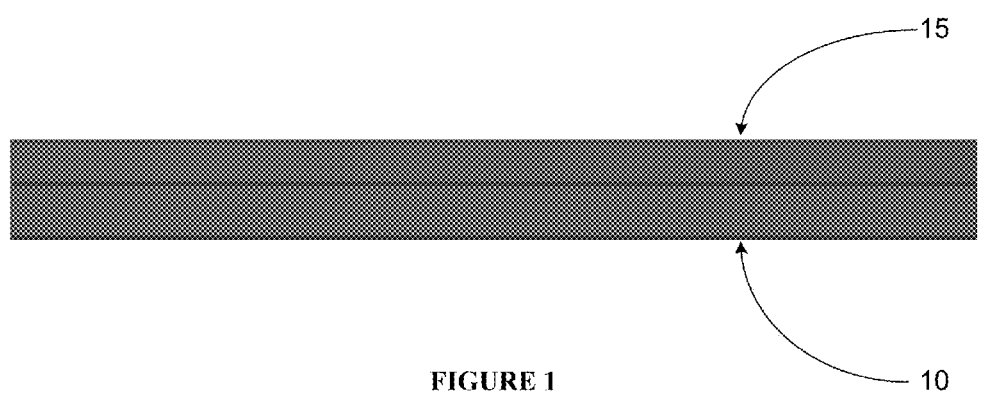
FIG. 1 shows some embodiments of a method for making semiconductor packages containing a reusable frame and a tape.

The Figures illustrate specific aspects of the semiconductor packages and methods for making such packages. Together with the following description, the Figures demonstrate and explain the principles of the methods and structures produced through these methods. In the drawings, the thickness of layers and regions are exaggerated for clarity. It will also be understood that when a layer, component, or substrate is referred to as being "on" another layer, component, or substrate, it can be directly on the other layer, component, or substrate, or intervening layers may also be present. The same reference numerals in different drawings represent the same element, and thus their descriptions will not be repeated.

DETAILED DESCRIPTION

The following description supplies specific details in order to provide a thorough understanding. Nevertheless, the skilled artisan would understand that the devices and associated methods of making and using the devices can be implemented and used without employing these specific details. Indeed, the devices and associated methods can be placed into practice by modifying the illustrated devices and associated methods and can be used in conjunction with any other apparatus and techniques conventionally used in the industry. For example, while the description below focuses on methods for making for semiconductor packages in the IC industry, it could be used in and applied to other electronic devices like optoelectronic devices, solar cells, MEMS structures, lighting controls, power supplies, and amplifiers.

Some embodiments of the semiconductor packages and methods for making such packages are shown in FIGS. 1-17. In these embodiments, the methods for making the semiconductor packages begin by providing a carrier frame (or frame) 10, as shown in FIG. 1. The carrier frame 10 can be any frame that is low-cost, reusable and can support the process requirements described herein, as well as any frame that can re-used as a substrate for tape 15. The carrier frame 10 can be manufactured by any known process, such as a stamping, or etching process.

The carrier frame 10 can have any size and thickness that is needed to operate as a support substrate during the manufacturing process and yet be re-usable. Thus, the size and thickness of the carrier frame 10 will depend on the size and density of the semiconductor package, as well as the semiconductor die (or dies) that will be contained in semiconductor package. The carrier frame 10 can comprise any metal or metal alloy known in the art, including Cu, steel alloy, or combinations thereof. In some embodiments, the frame 10 comprises Cu or steel alloy. In other embodiments, the carrier frame can comprise non-metal materials that can withstand molding temperature and have the required physical strength to support the components of the semiconductor package during assembly process until the frame 10 is removed. In some embodiments, the lead frame is substantially rectangular with a size ranging from about 9,000 to about 20,000 mm$^2$ and a thickness ranging from about 0.15 to about 0.5 mm.

As shown in FIG. 1, a tape 15 can then be provided on the carrier frame 10. The tape 15 is supported by the carrier frame 10 and so can be made of a flexible or a semi-flexible material. As well, once the semiconductor package is formed, the tape (and the carrier frame) can be removed. So the tape can be made of any material that is partially adhesive, but can be removed when molding process is complete or when it is peeled off. Any material having these characteristics can be used, including polyimide, silicone-free tape, or other thin-film materials. While the width and length of the tape 15 can be substantially similar to that of the carrier frame 10, the thickness of the tape 15 can range from about 0.008 mm to about 0.05 mm.

Figure 2:
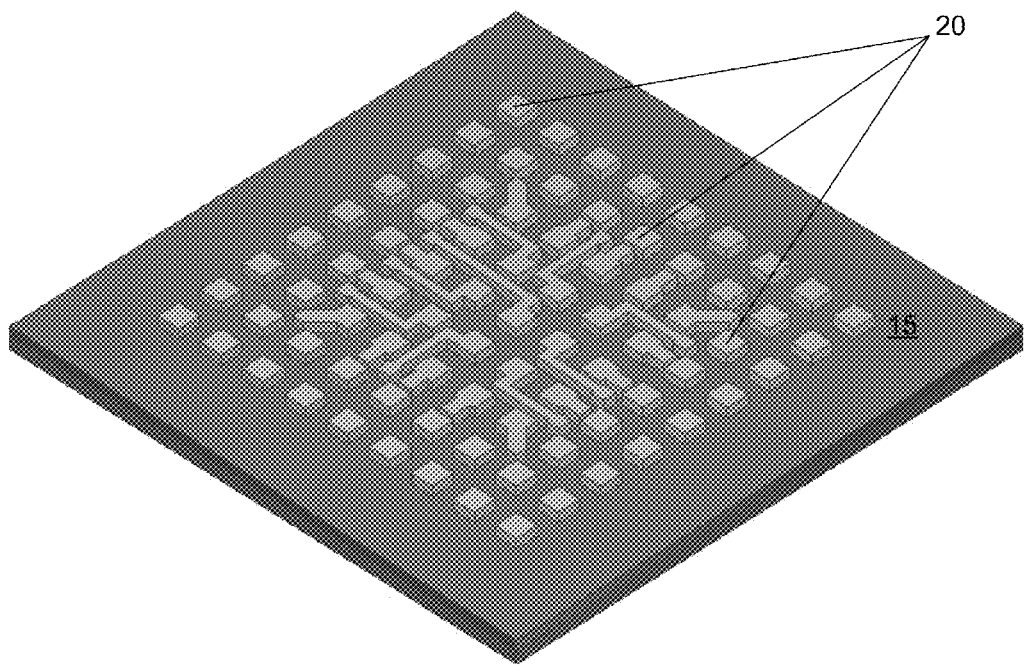
FIG. 2 depicts some embodiments of a method for making semiconductor packages containing a first interconnect structure.

As shown in FIG. 2, a first interconnect structure 20 can then be provided on the tape 15. The interconnect structure 20 serves to electrically connect a die (or dies) containing an IC device with an external device (i.e., a printed circuit board) in the completed semiconductor package. As well, when the carrier frame 10 and tape 15 are removed, the interconnect structure 20 will also serve as the land pad array for the semiconductor package. Thus, the interconnect structure 20 can have any pattern that serves both as an interconnect and as a land pad array for the semiconductor packages.

In some embodiments, the pattern of the first interconnect structure 20 is depicted in FIG. 2. In these embodiments, the interior portion of the pattern contains those parts that will operate as land pads and/or will be connected to a first semiconductor die. The exterior portion of the interconnect structure 20 contains with those parts that will be connected to solder balls.

The first interconnect structure 20 can be made of any conductive material that can also serve as a land pad. In some embodiments, such as those depicted in FIG. 2, the interconnect structure can comprise any solderable and wire-bondable material, such as Au, Ag, Pd—Ag, Pt—Ag or combinations thereof.

The first interconnect structure 20 can be formed by any process that will provide the desired pattern on the tape 15. In some embodiments, the interconnect structure 20 can be formed by using any known deposition process, and known masking and etching process. In other embodiments, the interconnect structure 20 can be made by any dispensing or screen printing process known in the art, such as by using a mesh stainless steel screen and then allowing the wet prints to level for 5 to 10 minutes before drying using a convection oven or belt dryer for 10 to 15 minutes.

Figure 3:
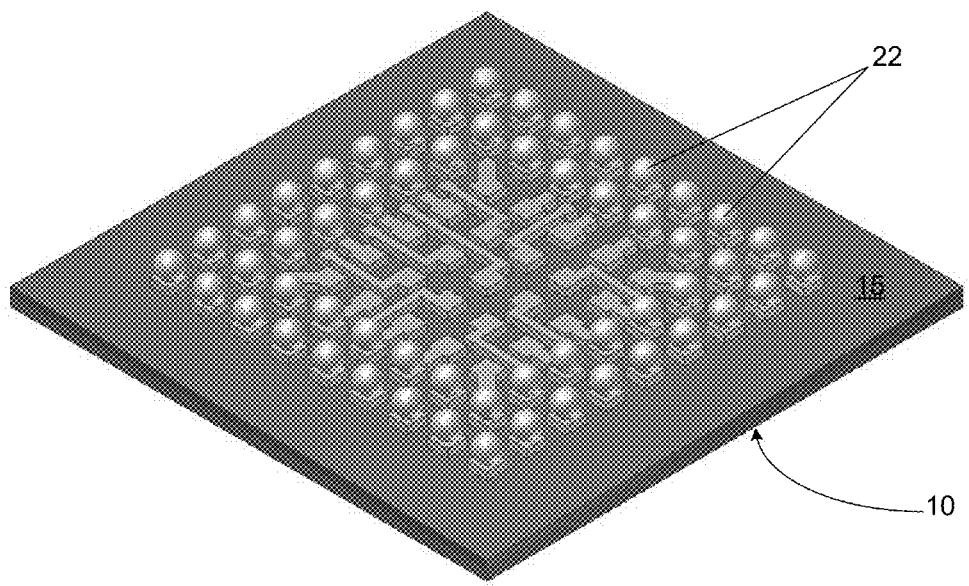
FIG. 3 shows some embodiments of a method for making semiconductor packages containing solder balls on a middle portion and an outer part of the first interconnect structure.

Next, solder balls 22 are formed on the exterior portion of the first interconnect structure 20, as shown in FIG. 3. The solder balls 22 can comprise any known solder material, such as Sn, Pb, Ag, Cu, Sb, Au, and can be formed using any known process, including a solder ball drop process or a printing and reflow process. In some embodiments, the solder bumps could be used in place of solder balls 22.

Next, a semiconductor die 25 (or die) containing an IC device is disposed on the interconnect structure 20. The die 25 may be made of any suitable semiconductor material. Some non-limiting examples of such materials may include silicon, polysilicon, gallium arsenide, silicon carbide, gallium nitride, silicon and germanium, and combinations thereof.

The die 25 can contain any number of IC devices. The IC device may be any known integrated circuit in the art. Some non-limiting examples of these devices may include logic or digital IC device, linear regulators, audio power amplifiers, LDO, driver IC, diodes, and/or transistors, including zener diodes, schottky diodes, small signal diodes, bipolar junction transistors ("BJT"), metal-oxide-semiconductor field-effect transistors ("MOSFET"), insulated-gate-bipolar transistors ("IGBT"), and insulated-gate field-effect transistors ("IGFET").

In some embodiments, any known flipchip process can be used to attach the first die 25 to the first interconnect structure. In these embodiments, the IC device(s) on the first die 25 can be provided with a bond pad as known in the art. In some embodiments, the bond pads can be provided in those areas that overlay the IC device(s). The bond pads can be formed in the desired location by any process known in the art (such as a redistribution method) and can be made of any known solderable material, including Au, Cu, Ag, Ti, Ni, Sn, W, Ni, or combinations thereof.

An array of solder bumps (or pillars) can then be provided on the bond pads. The bumps can be made of conductive material such as Ag, Sn, Pb, Cu, Sb, Au or combinations thereof. The bumps can be provided on the bond pads through any process known in the art, including electroless plating, ball drop, or printing. Then, the die 25 is flipped and placed on the interconnect structure so the bond pad (through the bumps) is attached to the desired locations of the first interconnect structure.

Figure 4:
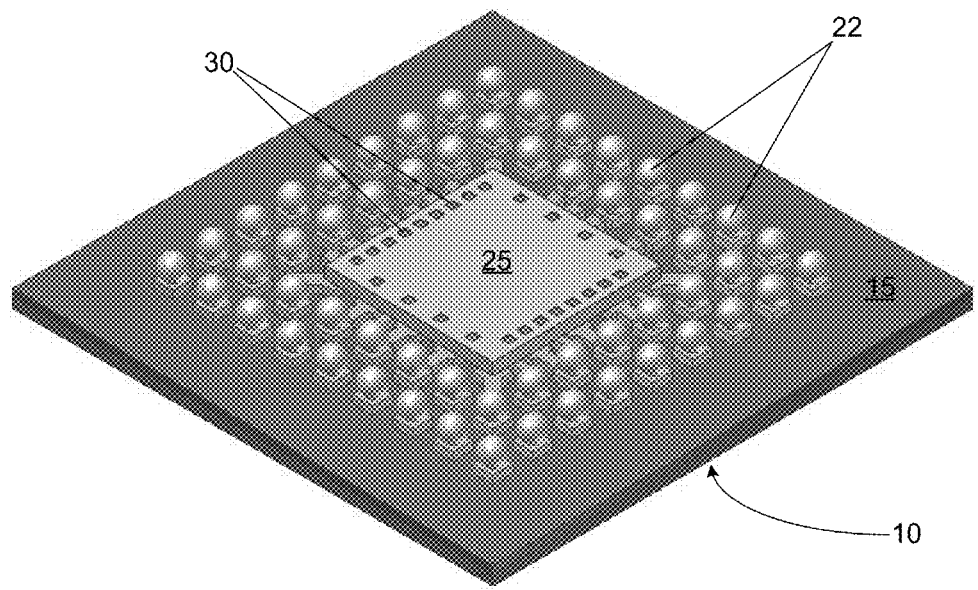
FIGS. 4 and 5 show some embodiments of a method for making semiconductor packages containing a first semiconductor die attached to an inner part of the first interconnect structure by wirebonds.
Figure 5:
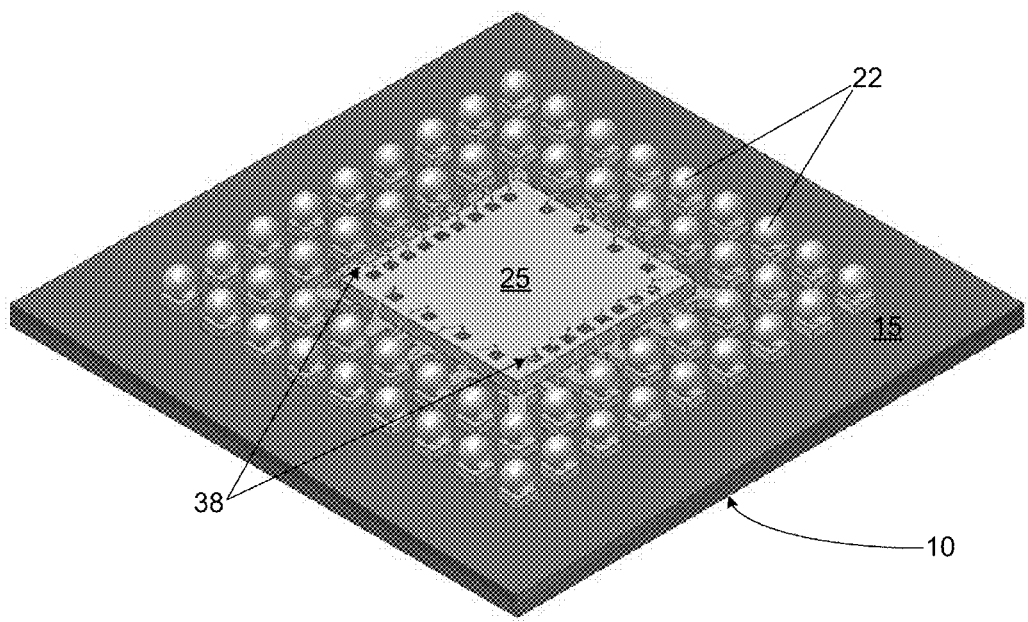

In other embodiments, such as those shown in FIGS. 4-5, the first die 25 is attached to the first interconnect structure 20 by any known die bonding process. In these embodiments, the semiconductor die 25 containing the IC device(s) will be attached to the first interconnect structure 20 by using any known pick & place process. After being attached, the exterior portions of the interconnect structure 20 remain exposed and are not covered by the die 25.

In these embodiments, the die 25 contains contact pads 30 that are available for electrical connection to the wirebonds. Typically, these contact pads 30 are located in the periphery of the die 25, as illustrated in FIG. 4, and can be made by any process known in the art. The contact pads 30 can be electrically connected to the exposed parts of the interconnect structure 20 in any known manner, including any known wire bonding process as shown in FIG. 5. In such instances, the bonding wire 38 may be made of any wire bonding material and can have any suitable size. Some non-limiting examples of wire bonding materials may include Au, Cu, and combinations thereof. Where Au is used, the bonding wire may have a diameter from about 12 micrometers to about 50 micrometers.

Figure 6:
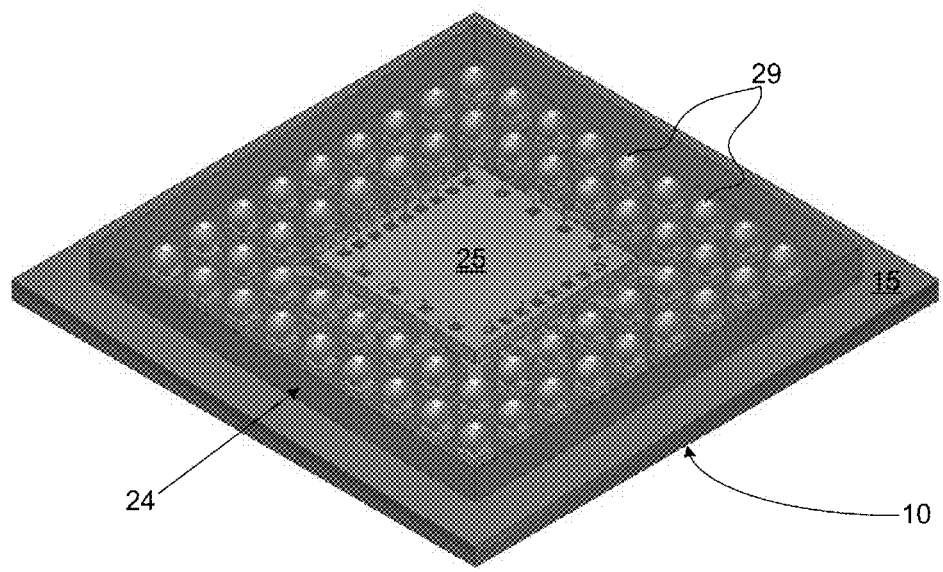
FIGS. 6 and 7 depict some embodiments of a method for making semiconductor packages containing a pre-molding layer.
Figure 7:
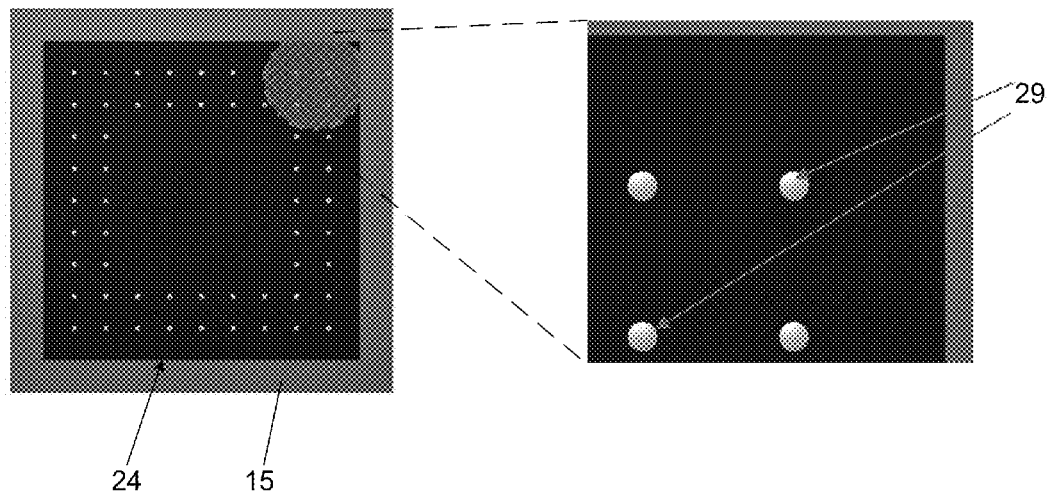

As shown in FIG. 6, a first pre-molding layer 24 can then be provided on the tape 15, around the first interconnect structure 20, first die 25, and the solder balls 22. The pre-molding layer 24 can be made of any material known in the art, such as an epoxy molding compound, a thermoset resin, a thermoplastic material, or a potting material. The pre-molding layer 24 can be provided in any manner known in the art such as transfer molding or compression molding. In some embodiments, such as where the pre-molding layer is made of potting material, it is deposited on the tape 15 by dispensing and then planarizing by any physical action until the upper surfaces 29 of the solder balls 22 are exposed, as shown in FIG. 7.

Figure 8:
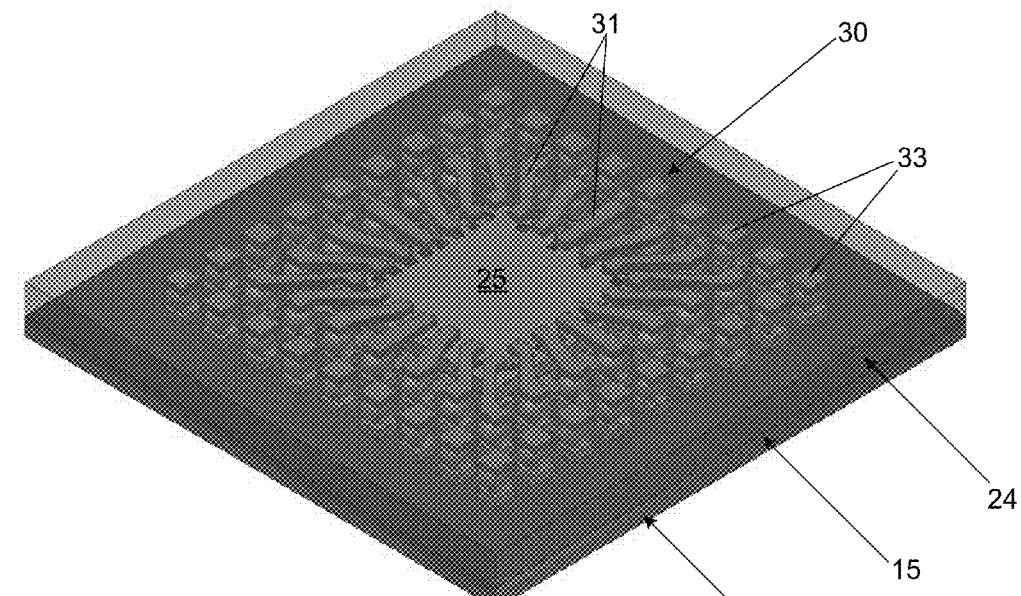
FIG. 8 depicts some embodiments of a method for making semiconductor packages containing a second interconnect structure.

A second interconnect structure 30 can then be provided on the pre-molding layer 24 and the upper surfaces of the solder balls 22. The second interconnect structure 30 contains routing leads that serve to electrically connect a second semiconductor die to an external device (i.e., the PCB) in the completed semiconductor package. The second interconnect structure 30 also contains pads that serve to electrically connect a third semiconductor die containing to the PCB) in the completed semiconductor package. Thus, the second interconnect structure 30 can have any pattern that serves both as an interconnect for both the second and third semiconductor dies. In some embodiments, the pattern of the interconnect structure 30 is depicted in FIG. 8 with inner routing leads 31 and outer routing leads 33. The second interconnect structure 30 can be made of any conductive material that is the same or different than the first interconnect structure 20.

The second interconnect structure 30 can be formed by any process that will provide the desired pattern on the pre-molding layer 24. In some embodiments, the second interconnect structure 30 can be formed by using any known deposition process, and known masking and etching process. In other embodiments, the second interconnect structure 30 can be made by any dispensing or screen printing process known in the art.

Figure 9:
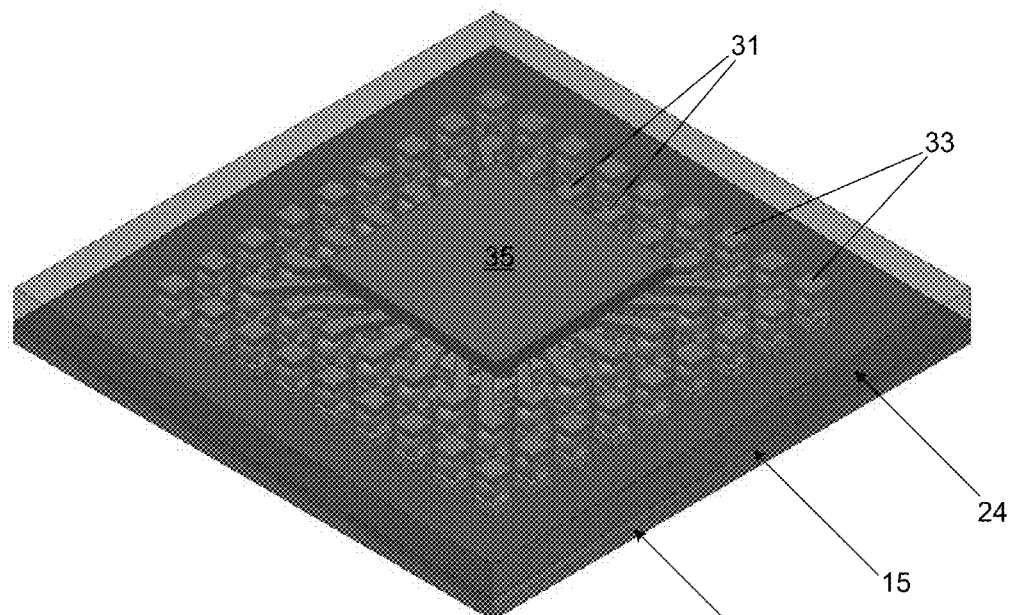
FIG. 9 depicts some embodiments of a method for making semiconductor packages containing a second semiconductor die.

Next, as shown in FIG. 9, a second semiconductor die (or IC die) 35 is attached to the routing leads 31. The second die 35 may be made of the same or different materials than those used in the first die. The second die 35 can contain any number of IC devices that may be the same or different than the device(s) used in the first die 25.

The second semiconductor die 35 can be attached to the routing leads 30 using any known flipchip process. Accordingly, similar to the first semiconductor die, bond pads are formed on the desired locations of the IC die(s) and bumps are applied to the bonds pads. The die 35 is then flipped and attached so that the bond pads are attached to the desired locations of the routing leads 31 through the bumps.

Figure 10:
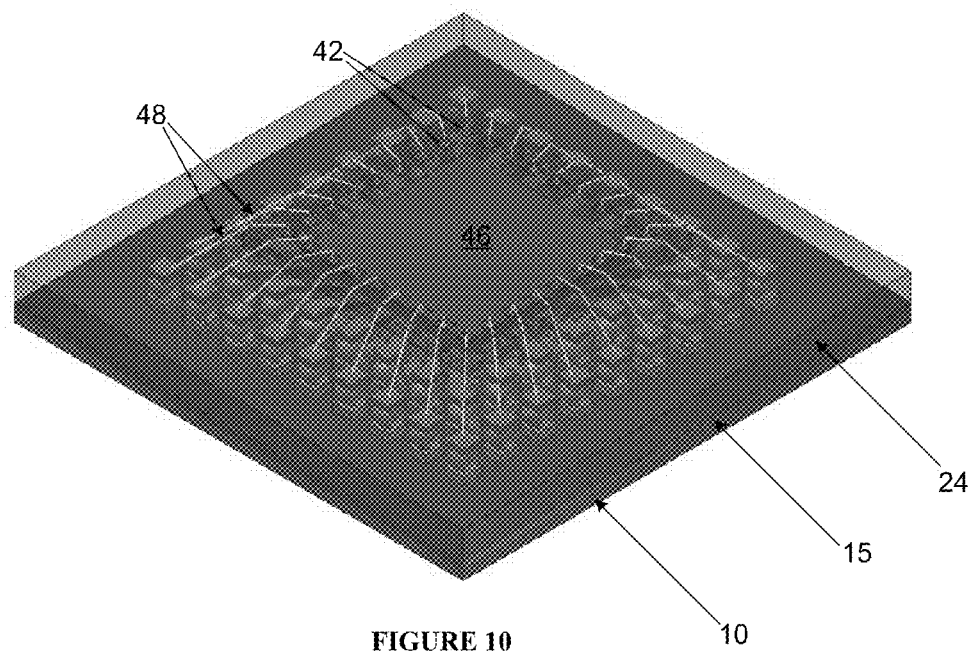
FIG. 10 depicts some embodiments of a method for making semiconductor packages containing a third semiconductor die.

As shown in FIG. 10, a third semiconductor die (or IC die) 46 is then attached to the backside of the second die 35 through any known process, such as any known pick & place process. The third semiconductor die 46 is then electrically connected to the routing leads 33 by a wirebonding process. In these embodiments, the third die 46 contains contact pads 42 that are available for electrical connection to the wirebonds 48. Typically, these contact pads 42 are located in the periphery of the die 46, as illustrated in FIG. 10, and can be made by any process known in the art. The contact pads 42 can then be electrically connected to the routing leads 33 by any known wire bonding process. The bonding wire 48 may be made of any wire bonding material and can have any suitable size. Some non-limiting examples of wire bonding materials may include Au, Cu, and combinations thereof.

Figure 11:
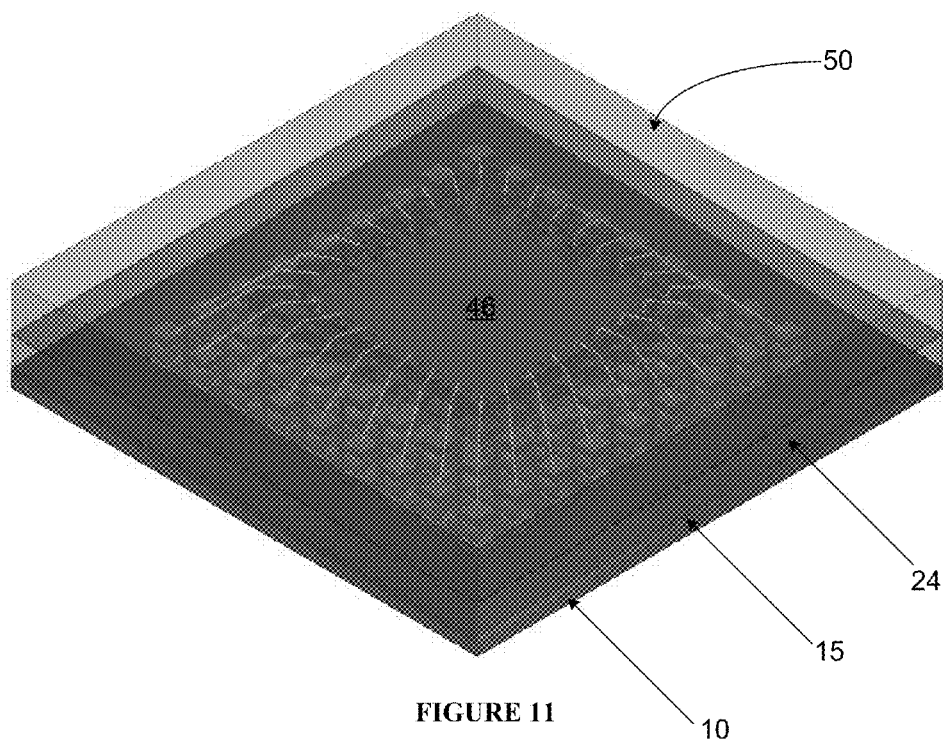
FIG. 11 depicts some embodiments of a method for making semiconductor packages containing a molding layer.
Figure 12:
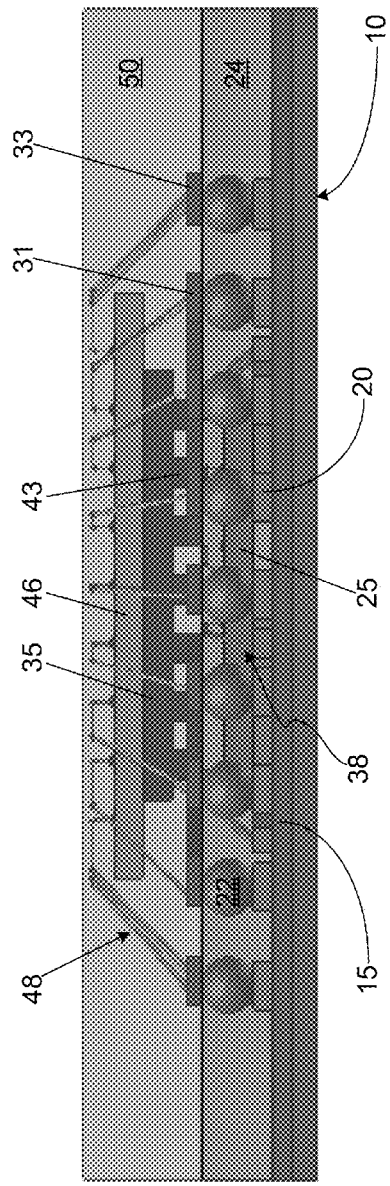
FIG. 12 shows a side view of some embodiments of a semiconductor package containing a molding layer.

An encapsulation process is then performed on the resulting structure. The encapsulation process uses any molding material known in the art. In some embodiments, the molding material can comprise an epoxy molding compound, a thermoset resin, a thermoplastic material, or potting material. In other embodiments, the molding material comprises an epoxy molding compound. In FIG. 11, the molding material 50 is shown in phantom to better illustrate the internal components of semiconductor package. The molding material 50 does not encapsulate the components already encapsulated by the pre-molding layer 24. The molding material 50, however, can cooperate with this pre-molding layer 24 to encapsulate the desired components of the semiconductor package except for the bottom (where the land pad array will be). A side view of the structure resulting after the encapsulation has been performed is illustrated in FIG. 12.

The process for making the semiconductor package continues when the carrier frame 10 and the tape 15 are removed. In this process, both of these components can be removed by any process that will not damage the structure that remains after their removal. In some embodiments, the removal process can be performed by peeling off the tape and the carrier frame using a tape remover machine with automatic handling system.

Figure 13:
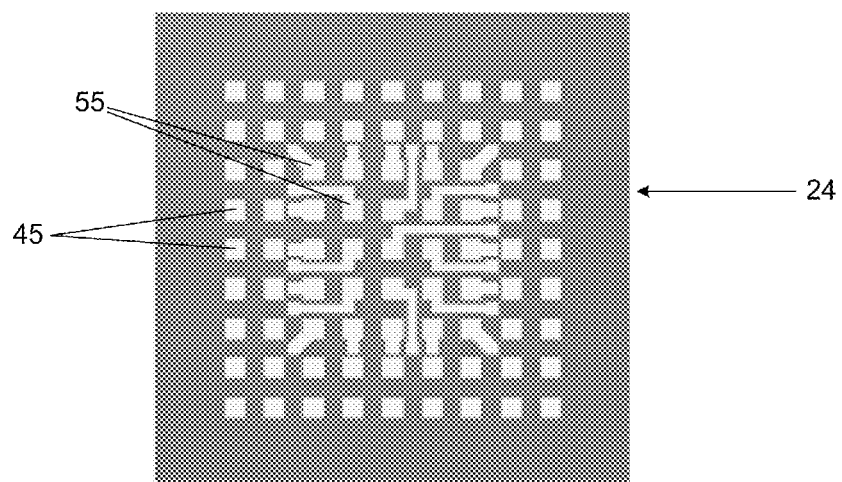
FIG. 13 depicts a bottom views of some embodiments of a semiconductor package containing a land pattern before a solder mask has been formed.

The removal of the carrier frame 10 and the tape 15 leaves the pattern of the first interconnect structure 20 exposed since the molding material 50 does not encapsulate the bottom surface of the interconnect structure 20. Thus, the bottom surface contains an array of land pads or lands 45, as shown in FIG. 13. The interconnect pattern 20 re-routes the electrical signal received from the wirebonds (at the exterior of the pattern) and re-routes it via path 55 to the interior of the pattern where the land pads 45 will be located. The land pads 45 can have any configuration or layout known in the art consistent with their operation in the semiconductor package. Thus, in the illustrated embodiments, the lands 45 are given a substantially rectangular configuration with a size ranging from about 0.04 to about 0.25 mm$^2$. In other embodiments, though, the lands 45 can have a round or other suitable geometrical shape.

Figure 14:
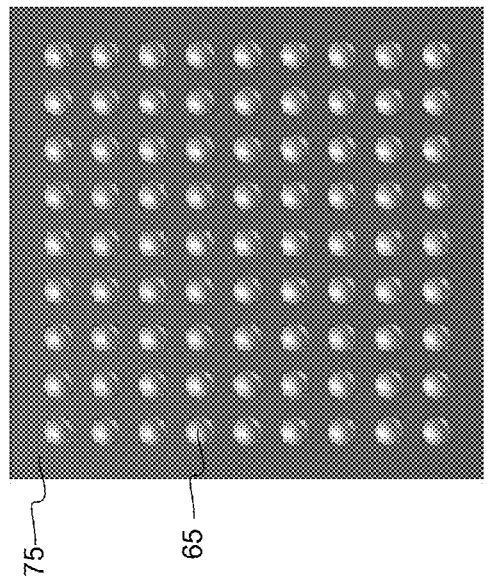
FIG. 14 shows bottom views of some embodiments of a semiconductor package containing a land pattern after a solder mask has been formed.

A masking process can then be performed, resulting in the structure depicted in FIG. 14. The mask 75 covers the bottom of the pre-molding layer 24 that is located within the interconnect structure 20 and also covers the re-routing portions 55 of the interconnect pattern 20, thereby leaving only the land pads 45 exposed. The material for the mask 75 can comprise any material that provides a substantially permanent protective coating and can prevent bridging between conductive materials or lands, such as an epoxy liquid, a liquid photoimageable solder mask, or a dry film photoimageable solder mask. The masking process can be performed using any procedure known in the art, such as silkscreen printing-exposed-developed process or vacuum laminate-exposed-developed process.

Figure 16:
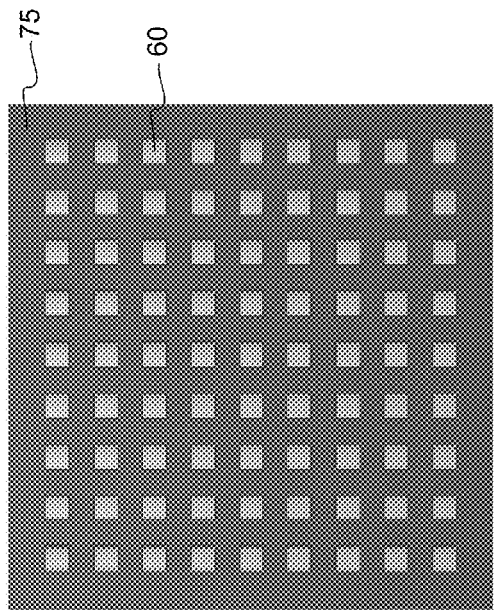

Next, a solder connector is provided on the land pads 45. The solder connector can be used in the connection to the external device (i.e., a printed circuit board) and, therefore, the specific connector can be selected with the specific external device in mind. In some embodiments, such as shown in FIG. 16, the solder connectors comprise solder bumps 60. The solder bumps 60 can comprise any known solder material, such as Sn, Pb, Ag, Cu, Sb, Au, and can be formed using any known bumping process, including a dispensing or screen printing process.

Figure 15:
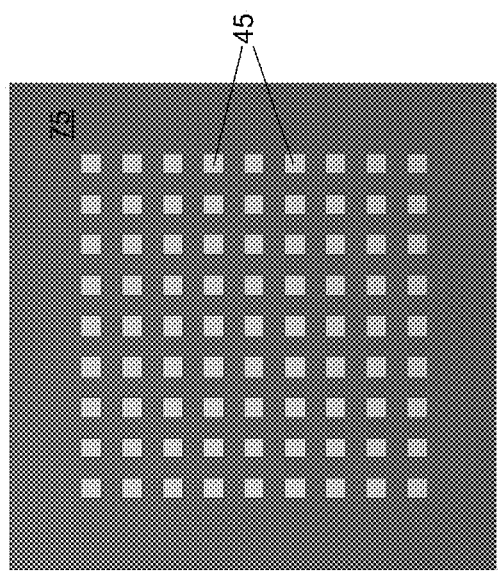
FIGS. 15-16 depicts some embodiments of a method for making semiconductor packages showing solder bumps or solder balls on the exposed lands.

In other embodiments, such as shown in FIG. 15, the solder connectors comprise solder balls 65. The solder balls 65 can comprise any known solder material, such as Sn, Pb, Ag, Cu, Sb, Au, and can be formed using any known process, including a solder ball drop or printing process.

The molded semiconductor package with the solder connectors is then singulated. The singulation of the molded semiconductor package can be carried out using any process known in the art, including a saw singulation process or a water jet singulation process. Then, the singulated semiconductor packages may be electrically tested, taped, and reeled using any processes known in the art. The semiconductor packages can then be connected to a printed circuit board using the solder connectors and used in any electronic device known in the art such as portable computers, disk drives, USB controllers, portable audio devices, or any other portable/ultraportable electronic devices.

Figure 17:
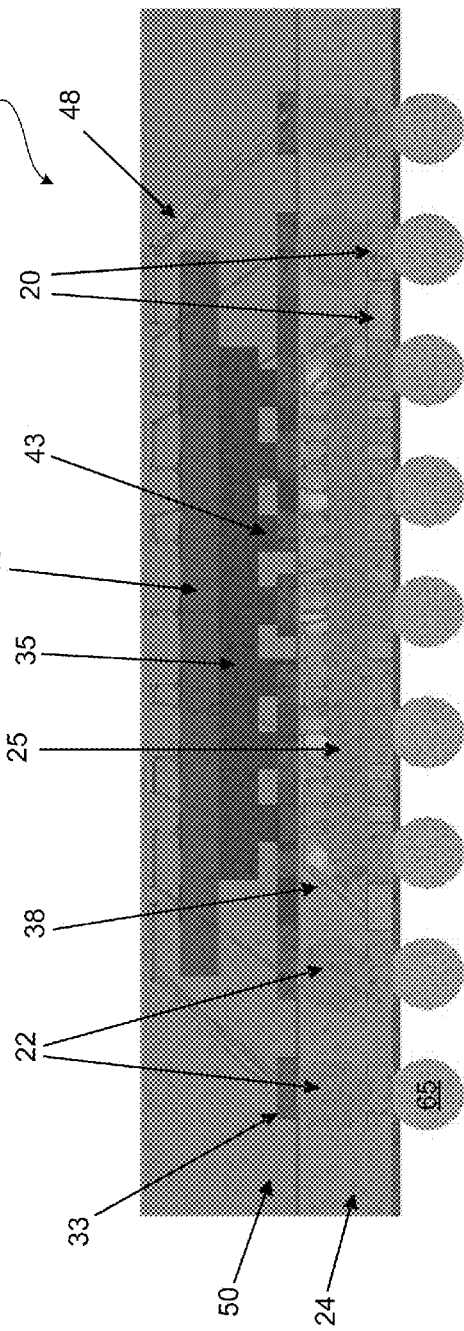
FIG. 17 depicts a side view of some embodiments of a method for making semiconductor packages showing a singulated package.

The completed semiconductor package 100 is shown in the side view of FIG. 17 (for the solder ball embodiments). The package 100 contains the first semiconductor die 25 where the IC device(s) is connected to inner portion of lands pads (or lands) 45 that have been formed from the interior of interconnect structure 20. Where wirebonds 35 have been used, the electrical signals are re-routed using the paths 55. The pattern of the interconnect structure 20 can be routed and customized for a wide variety of land configurations. This allows the semiconductor package 100 to be configured with many different sizes and shapes and used with different die sizes and shapes.

The IC device(s) in the second die 35 are connected to middle portion of the land pads 45 through the solder balls 22 and the routing leads 31. The IC device(s) in the third die 46 are connected to the outside portion of the land pads through the solders balls 22 and routing leads 33. The land pads 45 remain exposed and are configured in a stand-off position so that they can be attached to the PCB or other external device using the solder balls 65 (or solder bumps 60).

The semiconductor packages formed by these methods have several features. First, the semiconductor packages contain a full array of land pads without using any leads, a leadframe, or a bismaleimide triazine (BT) substrate. Second, the methods are flexible enough to use both wirebonding and flipchip processes. Third, the semiconductor packages don't require any top or bottom etching processes to form the interconnect structures or the land pad array. Fourth, these packages contain multiple semiconductor dies that can be stacked on each other, yet do not use long wirebonds that are often used with stacked dies in ball grid array (BGA) packages. Fifth, the packages are also relatively thin thickness while also have the capability of a full land pad array. These features provide a high input/output (I/O) capability, flexible routing capability, smaller package footprint, and a cost effective manufacturing solution.

In addition to any previously indicated modification, numerous other variations and alternative arrangements may be devised by those skilled in the art without departing from the spirit and scope of this description, and appended claims are intended to cover such modifications and arrangements. Thus, while the information has been described above with particularity and detail in connection with what is presently deemed to be the most practical and preferred aspects, it will be apparent to those of ordinary skill in the art that numerous modifications, including, but not limited to, form, function, manner of operation and use may be made without departing from the principles and concepts set forth herein. Also, as used herein, examples are meant to be illustrative only and should not be construed to be limiting in any manner.

The invention claimed is:

1. A method for making semiconductor package, comprising:
   providing a carrier frame with a tape thereon;
   forming a first interconnect structure on the tape, the first interconnect structure comprising an inner portion, a middle portion, and an outer portion;
   forming solder balls on the middle and outer potions of the first interconnect structure;
   connecting a first die containing an integrated circuit device to the inner portion of the first interconnect structure;
   providing a first molding material around the first die and the solder balls except for an upper surface of the solder balls;
   providing first routing leads from an inner portion of the solder balls to the backside of the first die and second routing leads;
   attaching a second die containing an integrated circuit device to the first routing leads;
   connecting a third die containing an integrated circuit device to the second routing leads;
   providing a second molding material to encapsulate the first and second routing leads, second die, and the third die; and
   removing the carrier frame and the tape.

2. The method of claim 1, including connecting the first die to the inner portion of the first interconnect structure by wirebonding.

3. The method of claim 1, including connecting the second die to the first routing leads by a flipchip process.

4. The method of claim 1, including connecting the third die to the second routing leads by wirebonding.

5. The method of claim 1, wherein the first and second molding material encapsulate the semiconductor package except for parts of the first interconnect structure adjacent the tape.

6. The method of claim 1, further comprising forming a solder mask on the first interconnect structure and the first molding material, thereby forming an array of land pads.

7. The method of claim 6, further comprising providing solder connections on the land pads.

8. The method of claim 6, wherein the land pad array contains land pads that are not physically connected to each other.

9. A method for making an electronic apparatus, comprising:
   making a semiconductor package by:
      providing a carrier frame with a tape thereon;
      forming a first interconnect structure on the tape, the first interconnect structure comprising an inner portion, a middle portion, and an outer portion;
      forming solder balls on the middle and outer potions of the first interconnect structure;
      connecting a first die containing an integrated circuit device to the inner portion of the first interconnect structure;
      providing a first molding material around the first die and the solder balls except for an upper surface of the solder balls;
      providing first routing leads from an inner portion of the solder balls to the backside of the first die;
      providing second routing leads;

attaching a second die containing an integrated circuit device to the first routing leads;

connecting a third die containing an integrated circuit device to the second routing leads;

providing a second molding material to encapsulate the first and second routing leads, the second die, and the third die;

removing the carrier frame and the tape; and connecting the semiconductor package to a circuit board.

10. The method of claim 9, including connecting the first die to the inner portion of the first interconnect structure by wirebonding.

11. The method of claim 9, including connecting the second die to the first routing leads by a flipchip process.

12. The method of claim 9, including connecting the third die to the second routing leads by wirebonding.

13. The method of claim 9, wherein the first and second molding material encapsulate the semiconductor package except for parts of the first interconnect structure adjacent the tape.

14. The method of claim 9, further comprising forming a solder mask on the first interconnect structure and the first molding material, thereby forming an array of land pads.

15. The method of claim 14, further comprising providing solder connections on the land pads.

16. The method of claim 14, wherein the land pad array contains land pads that are not physically connected to each other.

* * * * *